(12) United States Patent
Song et al.

(10) Patent No.: US 11,329,115 B2
(45) Date of Patent: May 10, 2022

(54) DISPLAY SUBSTRATE, MANUFACTURING METHOD THEREOF, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Song, Beijing (CN); Liangchen Yan, Beijing (CN); Ce Zhao, Beijing (CN); Heekyu Kim, Beijing (CN); Yuankui Ding, Beijing (CN); Leilei Cheng, Beijing (CN); Yingbin Hu, Beijing (CN); Wei Li, Beijing (CN); Yang Zhang, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/620,653

(22) PCT Filed: Mar. 22, 2019

(86) PCT No.: PCT/CN2019/079284
§ 371 (c)(1),
(2) Date: Dec. 9, 2019

(87) PCT Pub. No.: WO2020/113858
PCT Pub. Date: Jun. 11, 2020

(65) Prior Publication Data
US 2021/0335946 A1 Oct. 28, 2021

(30) Foreign Application Priority Data
Dec. 6, 2018 (CN) .......................... 201811487553.9

(51) Int. Cl.
*H01L 27/32* (2006.01)
*H01L 51/00* (2006.01)
(Continued)

(52) U.S. Cl.
CPC ...... *H01L 27/3258* (2013.01); *H01L 27/3246* (2013.01); *H01L 27/3262* (2013.01);
(Continued)

(58) Field of Classification Search
CPC ............. H01L 27/3262; H01L 27/3246; H01L 27/3258; H01L 2251/5392;
(Continued)

(56) References Cited

U.S. PATENT DOCUMENTS 5,712,496 A * 1/1998 Takahashi ........... H01L 29/6675
257/64
8,367,489 B2 * 2/2013 Yamazaki ......... H01L 21/02631
438/156
(Continued)

FOREIGN PATENT DOCUMENTS

CN 1855484 A 11/2006
CN 101325209 A 12/2008
(Continued)

OTHER PUBLICATIONS

Machine translation, Li, Chinese Pat. Pub. No. CN 207517701U, translation date: Sep. 17, 2021, Espacenet, all pages. (Year: 2021).*
(Continued)

*Primary Examiner* — Victoria K. Hall
(74) *Attorney, Agent, or Firm* — WHDA, LLP (57) ABSTRACT

The present disclosure relates to a pixel structure. The pixel structure may include a base substrate; a first insulating island on a side of the base substrate; a first electrode on a side of the first insulating island opposite front the base substrate; a second electrode on the base substrate and at a
(Continued)

peripheral area of the first insulating island; an active layer electrically connected to the first electrode and the second electrode; a second insulating layer on a side of the active layer opposite from the base substrate; a gate electrode on a side of the second insulating layer opposite from the base substrate; and a third insulating layer on a side of the gate electrode opposite from the base substrate.

16 Claims, 6 Drawing Sheets

(51) Int. Cl.
   *H01L 51/56* (2006.01)
   *H01L 29/417* (2006.01)
   *H01L 29/786* (2006.01)

(52) U.S. Cl.
   CPC .. *H01L 29/41733* (2013.01); *H01L 29/78603* (2013.01); *H01L 29/78642* (2013.01); *H01L 29/78696* (2013.01); *H01L 51/0005* (2013.01); *H01L 51/56* (2013.01); *H01L 2227/323* (2013.01); *H01L 2251/5392* (2013.01)

(58) Field of Classification Search
   CPC ......... H01L 29/78642; H01L 29/78696; H01L 29/78603; H01L 29/41733
   See application file for complete search history.

(56) References Cited

U.S. PATENT DOCUMENTS

| | | | |
|---|---|---|---|
| 9,093,470 B1* | 7/2015 | Nelson | H01L 29/78642 |
| 9,117,914 B1* | 8/2015 | Ellinger | H01L 29/78603 |
| 9,123,815 B1* | 9/2015 | Nelson | H01L 27/1222 |
| 9,147,770 B1* | 9/2015 | Ellinger | H01L 29/78642 |
| 9,153,698 B2* | 10/2015 | Nelson | H01L 29/78642 |
| 9,198,283 B2* | 11/2015 | Ellinger | H01L 29/41733 |
| 9,202,898 B2* | 12/2015 | Ellinger | H01L 21/443 |
| 9,214,560 B2* | 12/2015 | Nelson | H01L 29/1037 |
| 9,331,205 B2* | 5/2016 | Nelson | H01L 29/7869 |
| 9,401,430 B1* | 7/2016 | Ellinger | H01L 29/78642 |
| 9,443,887 B1* | 9/2016 | Ellinger | H01L 27/1222 |
| 9,559,214 B2* | 1/2017 | Sasaki | H01L 29/42384 |
| 9,653,493 B2* | 5/2017 | Ellinger | H01L 27/1225 |
| 9,679,922 B2* | 6/2017 | Sasaki | H01L 29/42392 |
| 9,825,060 B2* | 11/2017 | Sasaki | H01L 27/1225 |
| 9,853,059 B2* | 12/2017 | Sasaki | H01L 27/1237 |
| 9,859,308 B1* | 1/2018 | Ellinger | H01L 29/78696 |
| 11,114,474 B2* | 9/2021 | Qu | H01L 29/41775 |
| 11,177,390 B2* | 11/2021 | Cho | H01L 29/78663 |
| 2004/0245524 A1* | 12/2004 | Hirakata | H01L 29/42384 257/59 |
| 2006/0175609 A1* | 8/2006 | Chan | H01L 29/78642 257/59 |
| 2006/0220542 A1 | 10/2006 | Suh et al. | |
| 2006/0231852 A1* | 10/2006 | Kususe | H01L 33/385 257/99 |
| 2007/0102731 A1 | 5/2007 | Sakagami | |
| 2008/0308810 A1 | 12/2008 | Akimoto | |
| 2009/0032809 A1* | 2/2009 | Kim | H01L 51/0512 257/40 |
| 2011/0049611 A1 | 3/2011 | Kiyotoshi et al. | |
| 2014/0103307 A1* | 4/2014 | Chang | H01L 29/66666 257/40 |
| 2015/0257283 A1* | 9/2015 | Ellinger | H01L 29/42384 427/97.5 |
| 2016/0126357 A1* | 5/2016 | Sasaki | H01L 27/1225 257/43 |
| 2016/0155851 A1* | 6/2016 | Sasaki | H01L 29/78642 257/43 |
| 2016/0197099 A1* | 7/2016 | Sasaki | H01L 29/66969 257/43 |
| 2016/0233251 A1* | 8/2016 | Sasaki | H01L 29/41733 |
| 2016/0293675 A1 | 10/2016 | Kim | |
| 2016/0307987 A1* | 10/2016 | Rankov | H01L 27/3246 |
| 2016/0365369 A1* | 12/2016 | Ellinger | H01L 27/1225 |
| 2016/0365370 A1* | 12/2016 | Ellinger | H01L 29/78642 |
| 2017/0005200 A1* | 1/2017 | Sasaki | H01L 27/1222 |
| 2017/0104014 A1* | 4/2017 | Sasaki | H01L 29/41733 |
| 2017/0271375 A1* | 9/2017 | Sasaki | H01L 27/1225 |
| 2017/0317110 A1* | 11/2017 | Lee | H01L 29/66765 |
| 2017/0330924 A1 | 11/2017 | Kim et al. | |
| 2018/0033842 A1 | 2/2018 | Bae et al. | |
| 2018/0315860 A1* | 11/2018 | Lu | H01L 29/41733 |
| 2019/0044007 A1* | 2/2019 | Sun | H01L 27/1222 |
| 2019/0206967 A1* | 7/2019 | Kim | H01L 25/074 |

FOREIGN PATENT DOCUMENTS

| | | | | |
|---|---|---|---|---|
| CN | 106129264 A | * | 11/2016 | ......... H01L 51/5004 |
| CN | 106129264 A | | 11/2016 | |
| CN | 107369691 A | | 11/2017 | |
| CN | 107665905 A | | 2/2018 | |
| CN | 207517701 U | * | 6/2018 | ............ H01L 27/12 |
| CN | 207517701 U | | 6/2018 | |

OTHER PUBLICATIONS

Machine translation, Zhou, Chinese Pat. Pub. No. CN 106129264A, translation date: Sep. 17, 2021, Espacenet, all pages. (Year: 2021).*
International Search Report dated Sep. 4, 2019, issued in counterpart application No. PCT/CN2019/079284. (12 pages).
Office Action dated Apr. 1, 2020, issued in counterpart CN application No. 201811487553.9, with English translation. (17 pages).

* cited by examiner

DISPLAY SUBSTRATE, MANUFACTURING METHOD THEREOF, AND DISPLAY APPARATUS

CROSS-REFERENCE TO RELATED APPLICATIONS

This is a 371 application of PCT/CN2019/079284 filed on Mar. 22, 2019, which claims benefit of the filing date of Chinese Patent Application No. 201811487553.9 filed on Dec. 6, 2018, the disclosure of which is hereby incorporated in its entirety by reference.

TECHNICAL FIELD

The present disclosure relates to display technologies, and in particular, to a display substrate, a manufacturing method thereof, and a display apparatus.

BACKGROUND

With continuous development of display technology, the organic light-emitting diode (OLED) display apparatus has become very popular due to its advantage such as self-luminous, wide viewing angle and high contrast. The OLED display apparatus mainly includes a base substrate, a thin film transistor array layer formed on the base substrate, and a light-emitting unit formed on the thin film transistor array layer. The light-emitting unit is in one-to-one correspondence with the pixel unit included in the OLED display apparatus, and the light-emitting layer included in the light-emitting unit is generally formed by an inkjet printing technology. Therefore, in order to enable the light-emitting layer to be accurately formed at a corresponding position, the prior art generally prepares a pixel defining layer on the thin film transistor array layer. The pixel defining layer defines a pixel opening area corresponding to the pixel unit in a one to one correspondence. As such, when the light-emitting unit is fabricated, ink printing technology can be used to stably and accurately drop ink droplets for forming the light-emitting layer into the pixel opening area.

BRIEF SUMMARY

An embodiment of the present disclosure provides a pixel structure. The pixel structure may include a base substrate; a first insulating island on a side of the base substrate; a first electrode on a side of the first insulating island opposite from the base substrate; a second electrode on the base substrate and at a peripheral area of the first insulating island; an active layer electrically connected to the first electrode and the second electrode; a second insulating layer on a side of the active layer opposite from the base substrate; a gate electrode on a side of the second insulating layer opposite from the base substrate; and a third insulating layer on a side of the gate electrode opposite from the base substrate. The third insulating layer encloses a groove structure with the first electrode; the third insulating layer covers at least a side surface of one of the active layer, the second insulating layer or the gate electrode to form the groove structure with the first electrode; a height of the first insulating island in a direction perpendicular to the base substrate is greater than a height of the second electrode in the direction perpendicular to the base substrate; and the first electrode and the second electrode are two different electrodes selected from a source electrode and a drain electrode.

Optionally, a surface of the second electrode opposite from the base substrate is not in a same level with a surface of the first insulating island opposite from the base substrate.

Optionally, the third insulating layer selves as side walls of the groove structure, and the first electrode serves as a bottom of the groove structure.

Optionally, the second electrode surrounds the first insulating island.

Optionally, the second electrode comprises a first sub-electrode and a second sub-electrode spaced apart from each other, and the first sub-electrode and the second sub-electrode are on opposite sides of the first insulating island.

Optionally, the second electrode is in contact with side surfaces of the first insulating island.

Optionally, the first electrode is conformal with the first insulating island.

Optionally, the active layer contacts with the first electrode, and side surfaces of the first insulating island and the second electrode.

Optionally, the second insulating layer is conformal with the active layer.

Optionally, the gate electrode is conformal with the second insulating layer.

Optionally, a portion of the third insulating layer is con formal with the gate electrode and another portion thereof covers side surfaces of the active layer, the second insulating layer and the gate electrode to form the groove structure with the first electrode.

Optionally, the active layer contacts with a side surface of the first insulating island and a side surface of the first electrode.

Optionally, at least a surface of the third insulating layer opposite from the base substrate is hydrophobic.

One embodiment of the present disclosure is a display apparatus, comprising the pixel structure according to one embodiment of the present disclosure.

One embodiment of the present disclosure is a method of manufacturing a pixel structure. The method may include forming a base substrate; forming a first insulating island on a side of the substrate; forming a first electrode on a side of the first insulating island opposite from the base substrate; forming a second electrode on the base substrate and at a peripheral area of the first insulating island; forming an active layer electrically connected to the first electrode and the second electrode; forming a second insulating layer on a side of the active layer opposite from the base substrate; forming a gate electrode on a side of the second insulating layer opposite from the base substrate; and forming a third insulating layer on a side of the gate electrode opposite from the base substrate. The third insulating layer encloses a groove structure with the first electrode; the third insulating layer covers at least a side surface of one of the active layer, the second insulating layer or the gate electrode to form the groove structure with the first electrode; a height of the first insulating island in a direction perpendicular to the base substrate is greater than a height of the second electrode in the direction perpendicular to the base substrate; and the first electrode and the second electrode are two different electrodes selected from a source electrode and a drain electrode.

Optionally, a surface of the second electrode opposite from the base substrate is not in a same level with a surface of the first insulating island opposite from the base substrate.

Optionally, the second electrode surrounds the first insulating island.

Optionally, the third insulating layer serves as side walls of the groove structure and the first electrode serves as a bottom of the groove structure.

Optionally, the second electrode comprises a first sub-electrode and a second sub-electrode spaced apart from each other, and the first sub-electrode and the second sub-electrode are on opposite sides of the first insulating island.

Optionally, The method of manufacturing a display substrate further comprises exposing a portion of the third insulating layer outside the groove structure to an ultraviolet ray, so that a surface of the portion of the insulating film layer outside the groove structure opposite from the base substrate is hydrophobic.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-3. When referring to the figures, like structures and elements shown throughout are indicated with like reference numerals.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Connected" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

It will be understood that when an element such as a layer, a film, a region or a substrate is relaxed to as being "on" or "under" another element, the element may be "directly" "on" or "under" another element, or an intermediate element may be present.

In the description of the following embodiments, specific features, structures, materials or characteristics may be combined in any suitable manner in any one or more embodiments or examples.

The pixel defining layer used in the related art is usually subjected to coating, exposing, developing and curing processes. Thus, the preparation process is very complicated. Furthermore, organic material used for the pixel defining layer tends to pollute the environment.

In order to further explain the display substrate and the manufacturing method thereof and the display apparatus provided by the embodiments of the present disclosure, detailed description will be made below with reference to the accompanying drawings. One example of the present disclosure provides a pixel structure. The pixel structure may include a base substrate; a first insulating island on a side of the base substrate; a first electrode on a side of the first insulating island opposite from the base substrate; a second electrode on the base substrate and at a peripheral area of the first insulating island; an active layer electrically connected to the first electrode and the second electrode; a second insulating layer on a side of the active layer opposite from the base substrate; a gate electrode on a side of the second insulating layer opposite from the base substrate; and a third insulating layer on a side of the gate electrode opposite from the base substrate. The third insulating layer encloses a groove structure with the first electrode. The third insulating layer covers at least a side surface of one of the active layer, the second insulating layer or the gate electrode to form the groove structure with the first electrode. A height of the first insulating island in a direction perpendicular to the base substrate is greater than a height of the second electrode in the direction perpendicular to the base substrate. The first electrode and the second electrode are two different electrodes selected from a source electrode and a drain electrode.

In one embodiment, a surface of the second electrode opposite from the base substrate is not in a same level with a surface of the first insulating island opposite from the base substrate. The third insulating layer may serve as side walls of the groove structure, and the first electrode may serve as a bottom of the groove structure. The second electrode may surround the first insulating island.

In one embodiment, the second electrode comprises a first sub-electrode and a second sub-electrode spaced apart from each other, the first sub-electrode and the second sub-electrode are on opposite sides of the first insulating island.

In one embodiment, the second electrode is in contact with side surfaces of the first insulating island.

In one embodiment, the first electrode is conformal with the first insulating island. "Conformal with" herein means that orthographic projection of the first electrode on the base substrate is substantially the same or located within orthographic projection of the first insulating island on the base substrate.

In one embodiment, the active layer contacts with the first electrode, and side surfaces of the first insulating island and the second electrode. In one embodiment, a portion of the active layer is in contact with the first electrode, a portion thereof is in contact with the second electrode, and a portion thereof is in contact with the side surface of the first insulating island and the first electrode.

In one embodiment, the second insulating layer is conformal with the active layer. That is, orthographic projection of the second insulating layer on the base substrate is substantially the same or located within orthographic projection of the active layer on the base substrate.

In one embodiment, the gate electrode is conformal with the second insulating layer. That is, orthographic projection of the gate electrode on the base substrate is substantially the same or located within orthographic projection of the second insulating island on the base substrate.

In one embodiment, wherein a portion of the third insulating layer is conformal with the gate electrode and another portion thereof covers side surfaces of the active layer, the second insulating layer and the gate electrode to form the groove structure with the first electrode. That is, orthographic projection of a portion of the third insulating layer on the base substrate is substantially the same or located within orthographic projection of the gate electrode on the base substrate.

In one embodiment, the active layer contacts with a side surface of the first insulating island and a side surface of the first electrode.

FIGS. 1a-1i show a method of forming a display substrate according to one embodiment of the present application. As shown in FIGS. 1a-1i, the display substrate includes a base substrate 10, a thin film transistor array layer 100, a third insulating layer 17, and a plurality of light-emitting units. The thin film transistor array layer 100 is disposed on the base substrate 10, and the thin film transistor array layer 100 defines a plurality of groove structures 2 on a side of the thin film transistor array layer opposite from the base substrate 10. The third insulating layer 17 is disposed on a side of the thin film transistor array layer 100 opposite from the base substrate 10. The third insulating layer 17 defines a plurality of pixel regions 3 in the plurality of groove structures respectively. The pixel regions 3 and the groove structures 2 are in one to one correspondence. The plurality of light-emitting units is disposed in the plurality of pixel regions 3 in one-to-one correspondence.

In one embodiment, when the thin film transistor array layer 100 is formed on the base substrate 10, the position, shape and size of each film layer pattern included in the thin film transistor array layer 100 can be set such that the thin film transistor array layer 100 defines a plurality of groove structures 2 on a side opposite from the base substrate 10. Then, a third insulating layer 17 is formed on a side of the thin film transistor layer opposite from the base substrate 10, and the third insulating layer 17 can define a plurality of pixel regions 3 in the plurality of groove structures 2. Finally, light-emitting units can be formed correspondingly in the pixel regions 3.

It should be noted that the groove structure 2 defined by the thin film transistor array layer 100 has a depth which can at least accommodate the light-emitting layer in the light emitting unit. As such, when the third insulating layer 17 defines the pixel region 3 in the groove structure 2, the inner walls of the groove structure 2 corresponding to the pixel region 3 corresponds to a bank of a pixel defining layer in the prior art. The in-slot space of the groove structure corresponding to the pixel region is equivalent to the pixel opening area defined by the pixel defining layer in the prior art. When the light-emitting layer in the light-emitting unit is fabricated in the pixel region 3, an inkjet printing technology can be employed. The ink droplets for forming the light-emitting layer in the light-emitting unit can be stably and accurately dropped into the pixel region 3 to form a corresponding light-emitting layer.

It should be noted that the pixel region 3 is defined by the third insulating layer 17 so that it is also possible to prevent some of the film layers (for example, the gate electrode 16 and the like) having electrical conductivity in the thin film transistor array layer 100 from being short-circuited with the electrodes in the pixel unit.

According to specific structure and manufacturing process of the display substrate, in the display substrate provided by the embodiments of the present disclosure, a plurality of groove structures 2 are defined by the thin film transistor array layer 100. Then, a corresponding plurality of pixel regions 3 are defined in the plurality of groove structures 2 respectively through the insulating film layer 17. The inner wall of the groove structure 2 corresponding to the pixel region 3 is equivalent to the bank of the pixel defining layer in the prior art, and the in-slot space of the groove structure 2 corresponding to the pixel region 3 is equivalent to the pixel opening area defined by the pixel defining layer in the prior art. Therefore, when the light-emitting layer in the light-emitting unit is fabricated, the light-emitting layer can be directly formed in the pixel region 3 defined by the third insulating layer 17 by using an inkjet printing technique, and there is no need to additionally create a pixel defining layer to define the pixel region 3 for fabricating the light-emitting unit. Therefore, the method of fabricating the display substrate provided by the embodiment of the present disclosure avoids the processes of coating, exposing, developing and curing to form the pixel defining layer, thereby simplifying the manufacturing process of the display substrate. At the same time, potential problem of environmental pollution caused by the use of organic materials for the pixel defining layer is also avoided.

Figure 1A:
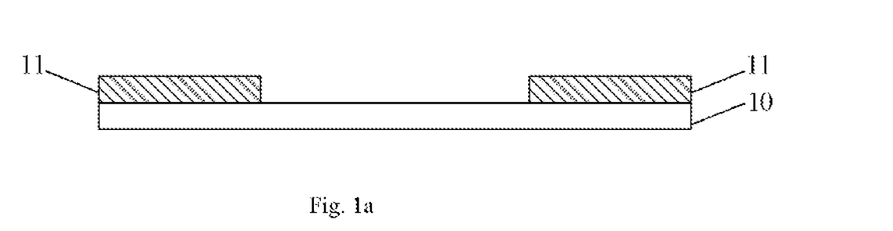
FIGS. 1a-1i are schematic diagrams showing a process of manufacturing a display substrate according to one embodiment of the present disclosure.
Figure 1B:
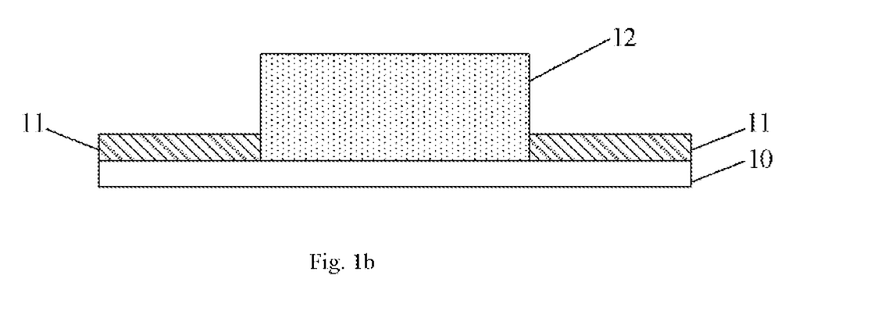
Figure 1C:
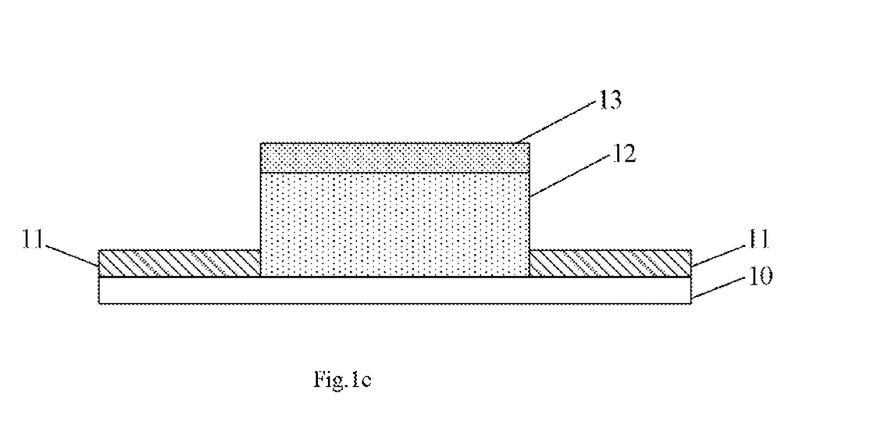
Figure 1D:
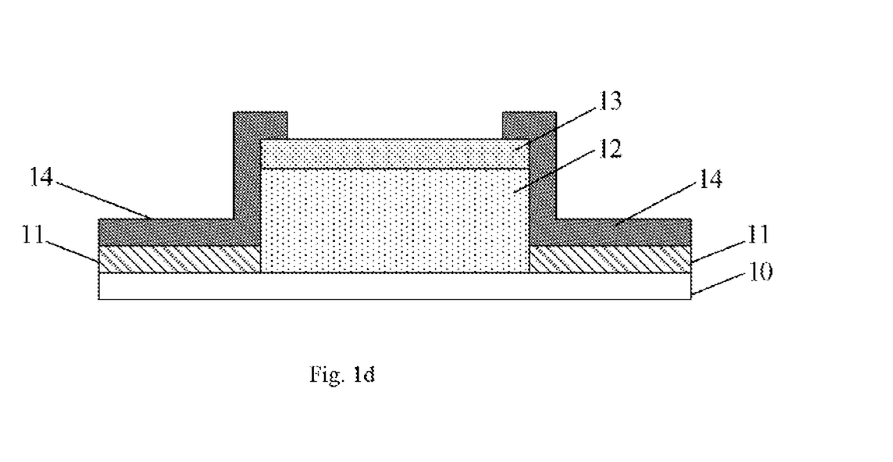
Figure 1E:
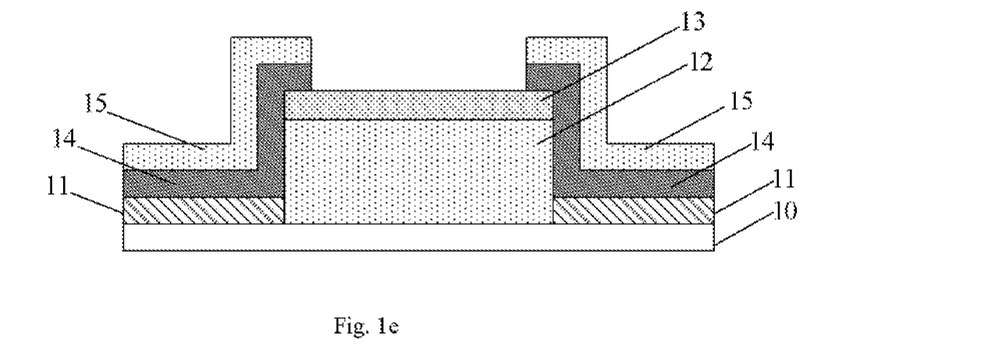
Figure 1F:
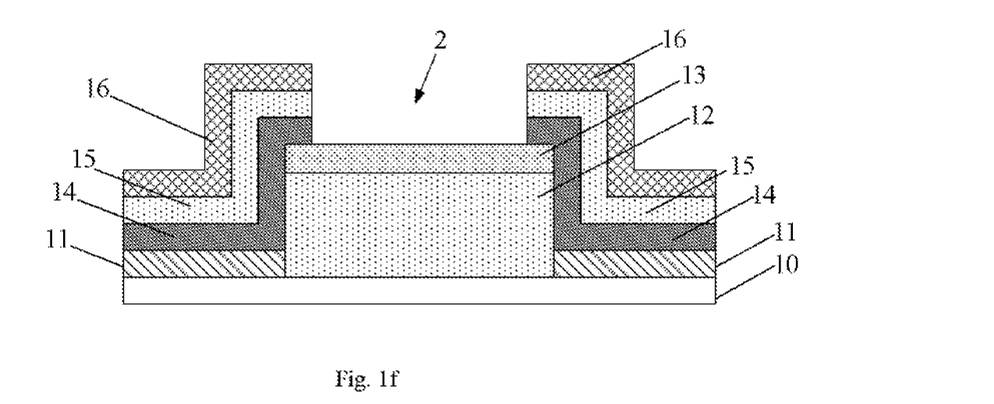
Figure 1G:
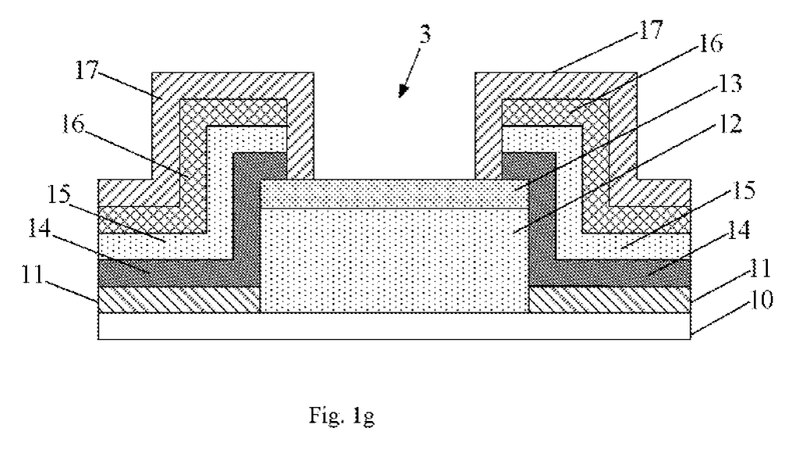
Figure 1H:
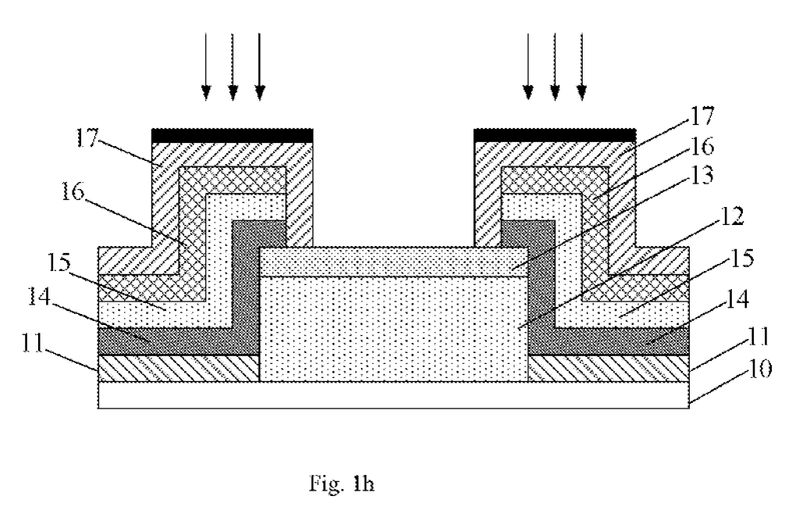
Figure 1I:
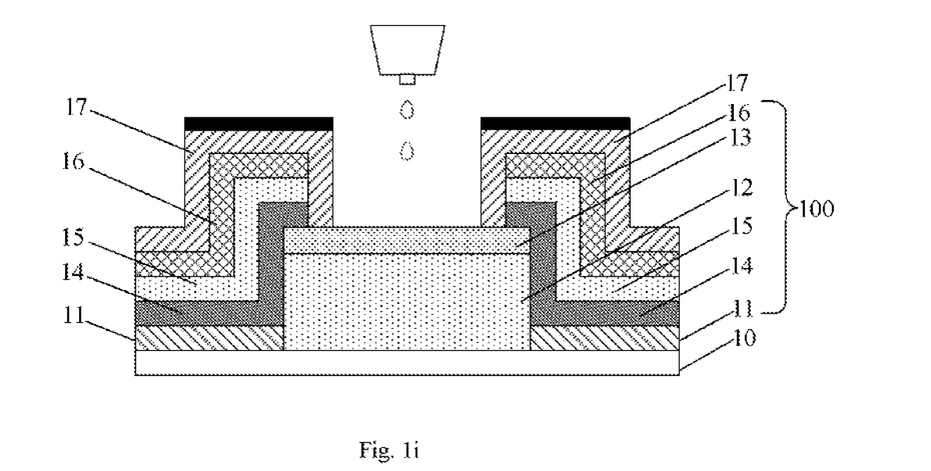

In some embodiments, as shown in FIG. 1f, the thin film transistor array layer 100 may include a plurality of thin film transistors, and each of the groove structures 2 corresponds to at least one thin film transistor. The at least one thin film transistor defines a corresponding groove structure 2, and an output electrode 13 of the at least one thin film transistor serves as a bottom of the groove structure 2. As shown in FIG. 1g, the third insulating layer 17 includes a plurality of openings corresponding to the plurality of groove structures 2 respectively. The opening exposes the first electrode, that is, the output electrode, 13 of the corresponding at least one thin film transistor. The output electrode 13 of the at least one thin film transistor is in contact with the corresponding light emitting unit. The at least one thin film transistor is configured to output a driving signal to the corresponding light-emitting unit through the output electrode 13 to drive the light-emitting unit to emit light.

In one embodiment, the thin film transistor array layer 100 may include a plurality of thin film transistors distributed in an array. Each of the groove structures 2 may be defined by a corresponding one or more thin film transistors, and each thin film transistor can only define one groove structure 2 correspondingly. The structure of the thin film transistor generally includes the gate electrode 16, the second electrode (that is, the input electrode) 11, the first electrode (that is, the output electrode) 13, the active layer 14, and the insulating layers, etc. The operational mode of the thin film transistor is that under the control of the gate electrode 16, the driving signal received by the input electrode 11 is output to the light-emitting unit through the output electrode 13 to drive the light-emitting unit to emit light. Therefore, in manufacturing the thin film transistor, the output electrode 13 in the thin film transistor can be disposed as the groove bottom of the groove structure 2 to be defined, and the output electrode 13 can be exposed by forming an opening in the third insulating layer 17. In this way, when the light-emitting unit is subsequently fabricated, the output electrode 13 can contacted the light-emitting unit more conveniently, thereby better driving the light-emitting unit to emit light.

It should be noted that the size of the opening provided on the third insulating layer 17 can be set according to actual needs. In one embodiment, the opening exposes only the output electrode 13 at the groove bottom of the groove structure 2 without exposing other film layers included in the thin film transistor. Specifically, the third insulating layer 17 may be provided to completely cover the inner side walls of the groove structure 2, so that the light-emitting unit formed in the pixel region 3 can only be in contact with the output electrode 13 at the bottom of the groove structure without contacting other film layers in the thin film transistor. Short circuit between the light-emitting unit and other film layers in the thin film transistor can be avoided, thereby ensuring stable performance of the display substrate.

In one embodiment, the light-emitting unit provided by the above embodiment includes two electrodes disposed opposite to each other and a light-emitting layer disposed between the two electrodes. The output electrode 13 of the at least one thin film transistor is in contact with the light-emitting layer in the corresponding light-emitting unit, and the output electrode 13 of the at least one thin film transistor is commonly used as one of the electrodes of the corresponding light-emitting unit.

Specifically, the output electrode 13 of the at least one thin film transistor corresponding to the light-emitting unit can be exposed through the opening in the third insulating layer 17, and the output electrode 13 can be in contact with the light-emitting unit and provide the driving signal for the light-emitting unit. Therefore, the output electrode 13 can be directly multiplexed into one of the light-emitting units. Thus, when the light-emitting unit is fabricated, the light-emitting layer can be directly formed on the output electrode 13. Then, the other electrode of the light-emitting unit can be fabricated on the side of the light-emitting layer opposite from the output electrode 13. As such, the manufacturing process of the light-emitting unit is simplified, and the manufacturing cost of the display substrate is reduced.

The manner in which the groove structure 2 is defined by the thin film transistor described above is various, and two specific definitions are given below for illustration purpose only.

Figure 2:
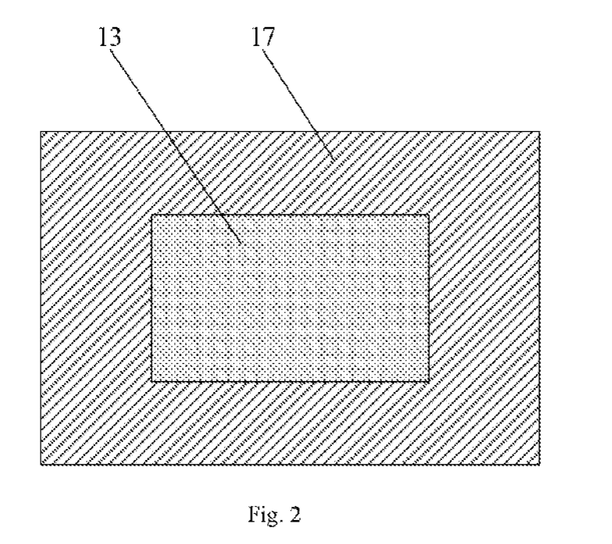
FIG. 2 is a first top plan view of a thin film transistor according to one embodiment of the present disclosure.

In the first manner, as shown in FIG. 2, each of the groove structures 2 corresponds to one thin film transistor, that is, one corresponding thin film transistor defines a corresponding groove structure 2. The thin film transistor specifically includes the following: an input electrode 11 and a first insulating island 12 in the same layer on the base substrate 10. In a direction perpendicular to the base substrate 10, a height of the first insulating island 12 is greater than a height of the input electrode 11. Orthographic projection of the input electrode 11 on the base substrate 10 surrounds orthographic projection of the first insulating island 12 on the base substrate 10.

In one embodiment, the thin film transistor further includes an output electrode 13 disposed on a surface of the first insulating island 12 opposite from the base substrate 10 and an active layer 14 disposed on a side of the input electrode 11 opposite from the base substrate 10. The active layer 14 is in contact with the input electrode 11 and a portion of the output electrode 13, respectively, and orthographic projection of the active layer 14 on the base substrate 10 surrounds orthographic projection of the output electrode 13 on the base substrate 10.

In one embodiment, the thin film transistor further includes a second insulating layer 15 and a gate electrode 16 disposed on one side of the active layer 14 opposite from the base substrate 10 and sequentially stacked in a direction away from the base substrate 10. Orthographic projection of the gate electrode 16 on the base substrate 10 is located inside orthographic projection of the second insulating layer 15 on the base substrate 10. The orthographic projection of the gate electrode 16 on the base substrate 10 and orthographic projection of the output electrode 13 on the base substrate 10 at least partially overlap. The orthographic projection of the gate electrode 16 on the base substrate 10 and the orthographic projection of the second insulating layer 15 on the base substrate 10 both surround the orthographic projection of the output electrode 13 on the base substrate 10.

Specifically, in the thin film transistor of the above structure, the input electrode 11 and the first insulating island 12 are formed on the base substrate 10, and the output electrode 13 is formed on the first insulating island 12 such that a height difference is formed between the input electrode 11 and the output electrode 13. Then, the active layer 14, the second insulating layer 15, and the gate electrode 16 are sequentially formed in stacks on the input electrode 11 and the output electrode 13, so that a height difference is formed between the gate electrode 16 and the output electrode 13. Since the active layer 14, the second insulating layer 15, and the gate electrode 16 are all formed around the output electrode 13 and expose a part of the output electrode 13, a groove structure 2 is formed on the output electrode 13. That is, the output electrode 13 serves as the groove bottom of the groove structure 2, and side walls of the active layer 14, the second insulating layer 15, and the gate electrode 16 serve as the inner walls of the groove structure 2. When the third insulating layer 17 is subsequently formed, the third insulating layer 17 can expose the output electrode 13 at the bottom of the groove structure while covering the inner walls of the groove structure 2 and the gate electrode 16 at the topmost layer of the thin film transistor.

The thin film transistor of the above structure can define a closed groove structure 2 such that the third insulating layer 17 can define a pixel region 3 in the groove structure 2 as a closed region. Thus, when the ink droplets for forming the light-emitting layer in the light-emitting unit are dropped into the pixel region 3 by the ink-jet printing technique, the ink droplets can be defined in the pixel region 3 without flowing into other non-pixel regions. As such, the ink droplets can be prevented from spreading into other areas to contaminate adjacent pixels, thereby causing cross-color phenomenon.

Figure 3:
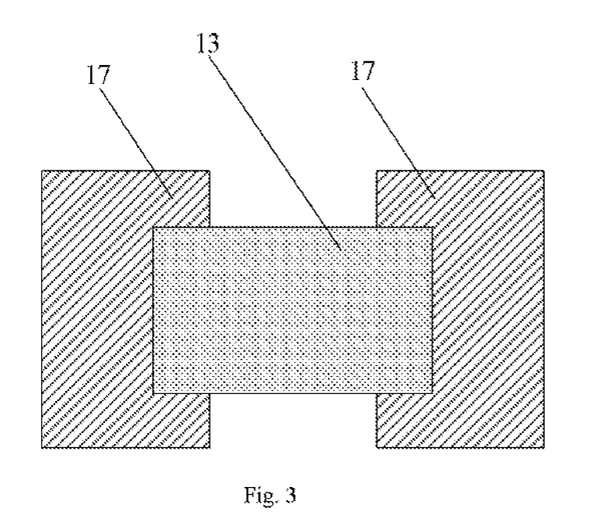
FIG. 3 is a second top plan view of a thin film transistor according to one embodiment of the present disclosure.

In the second manner, as shown in FIG. 3, each groove structure 2 corresponds to two thin trim transistors. That is, the corresponding groove structure 2 is defined by two thin film transistors. In this manner, two thin film transistors are disposed on opposite sides of the groove structure 2, and the thin film transistor specifically includes an input electrode 11 and a first insulating island 12 disposed in the same layer on the base substrate 10. The height of the first insulating island 12 is greater than the height of the input electrode 11 in a direction perpendicular to the base substrate 10.

In one embodiment, the thin film transistor further includes an output electrode 13 disposed on a surface of the first insulating island 12 opposite from the base substrate 10 and an active layer 14 disposed on a side of the input electrode 11 opposite from the base substrate 10. The active layer 14 is in contact with the input electrode 11 and a portion of the output electrode 13, respectively.

In one embodiment the thin film transistor further includes a second insulating layer 15 and a gate electrode 16 disposed on one side of the active layer 14 opposite from the base substrate 10 and sequentially stacked in a direction away from the base substrate 10. The orthographic projection of the gate electrode 16 on the base substrate 10 is located inside the orthographic projection of the second insulating layer 15 on the base substrate 10. The orthographic projection of the gate electrode 16 on the base substrate 10 at least partially overlaps the orthographic projection of the output electrode 13 on the base substrate 10.

In one embodiment, the gate electrodes 16 of the two thin film transistors are connected, the input electrodes 11 of the two thin film transistors are connected, and the two thin film transistors share the same output electrode 13 and the same first insulating island 12.

Specifically, in the thin film transistor of the above structure, the input electrode 11 and the first insulating island 12 are formed on the base substrate 10, and the output electrode 13 is formed on the first insulating island 12 such that a height difference is formed between the input electrode 11 and the output electrode 13. Then, the active layer 14, the second insulating layer 15 and the gate electrode 16 are sequentially formed in stacks on the input electrode 11 and the output electrode 13, thereby forming a height difference between the gate electrode 16 and the output electrode 13. Since the active layer 14, the second insulating layer 15, and the gate electrode 16 are stacked, and respectively expose a part of the output electrodes 13, the output electrode 13 serves as the groove bottom of the groove structure 2, and the sidewalls of the active layer 14, the second insulating layer 15, and the gate electrode 16 serve as the inner walls of the groove structure 2.

Therefore, two thin film transistors are disposed on opposite sides of the corresponding groove structure 2. The two thin film transistors can form the groove bottom of the groove structure 2 and the opposite side walls of the groove structure 2, so that the two thin film transistors define a non-closed groove structure 2. When the third insulating layer 17 is subsequently formed, the third insulating layer 17 can expose the output electrode 13 at the bottom of the groove structure while covering the inner sidewalls of the groove structure 2 and the gate electrode 16 at the topmost layer of the thin film transistor. When an inkjet printing technique is used to drop ink droplets for forming a light-emitting layer in a light-emitting unit into a pixel region, the ink droplets can also be confined in the pixel region without flowing into other non-pixel regions.

In one embodiment, in the above ram manners, the input electrode 11 may be a drain electrode, and the output electrode 13 may be a source electrode; or the input electrode 11 may be a source electrode, and the output electrode 13 may be a drain electrode.

In some embodiments, a surface of a portion of the third insulating layer 17 that is disposed outside the groove structure 2 opposite from the base substrate 10 may be hydrophobic. In one embodiment, the third insulating layer in the groove structure may also be hydrophobic.
Specifically, after the third insulating layer 17 is formed, a portion of the third insulating layer 17 outside the groove structure 2 may be exposed to an ultraviolet ray so that the surface of the portion of the third insulating layer 17 outside the groove structure 2 opposite from the base substrate 10 is hydrophobic. That is, a static water contact angle θ on the surface of the portion of the third insulating layer 17 outside the groove structure 2 opposite from the base substrate 10 is >90°.

Since the light-emitting layer in the light-emitting unit is generally fabricated by inkjet printing technology, the portion of the third insulating layer 17 disposed outside the groove structure 2 is hydrophobic on its surface opposite from the base substrate 10, thereby enabling droplets for forming the light-emitting layer to be printed into the pixel region more stably and accurately when the light-emitting layer is formed by inkjet printing technology.

One example of the present disclosure further provides a display apparatus, which comprises the display substrate provided by any of the above embodiments. One example of the present disclosure provides a method of manufacturing a pixel structure. The method may include forming a base substrate; forming a first insulating island on a side of the substrate; forming a first electrode on a side of the first insulating island opposite from the base substrate; forming a second electrode on the base substrate and at a peripheral area of the first insulating island; forming an active layer electrically connected to the first electrode and the second electrode; forming a second insulating layer on a side of the active layer opposite from the base substrate; forming a gate electrode on a side of the second insulating layer opposite from the base substrate; and forming a third insulating layer on a side of the gate electrode opposite from the base substrate. The third insulating layer encloses a groove structure with the first electrode. The third insulating layer covers at least a side surface of one of the active layer, the second insulating layer or the gate electrode to form the groove structure with the first electrode. A height of the first insulating island in a direction perpendicular to the base substrate is greater than a height of the second electrode in the direction perpendicular to the base substrate. The first electrode and the second electrode are two different electrodes selected from a source electrode and a drain electrode.

In one embodiment, a surface of the second electrode opposite from the base substrate is not in a same level with a surface of the first insulating island opposite from the base substrate. The second electrode surrounds the first insulating island. The second insulating layer serves as inner walls of the groove structure and the first, electrode serves as a bottom of the groove structure. In one embodiment, the second electrode comprises a first sub-electrode and a second sub-electrode spaced apart from each other, and the first sub-electrode and the second sub-electrode are on opposite sides of the first insulating island.

In the method of manufacturing the display substrate according to one embodiment of the present disclosure, the processes of coating, exposing, developing and curing used to fabricate the pixel defining layer are avoided. Thus, the preparation process of the display substrate is simplified. Moreover, the problem of environmental pollution caused by the use of organic material to form the pixel defining layer is also avoided. Therefore, when the display apparatus provided by the embodiments of the present disclosure includes the display substrate provided by the above embodiments, the display apparatus has the advantages of simple manufacturing process, low manufacturing cost, and no pollution to the environment.

Figure 4:
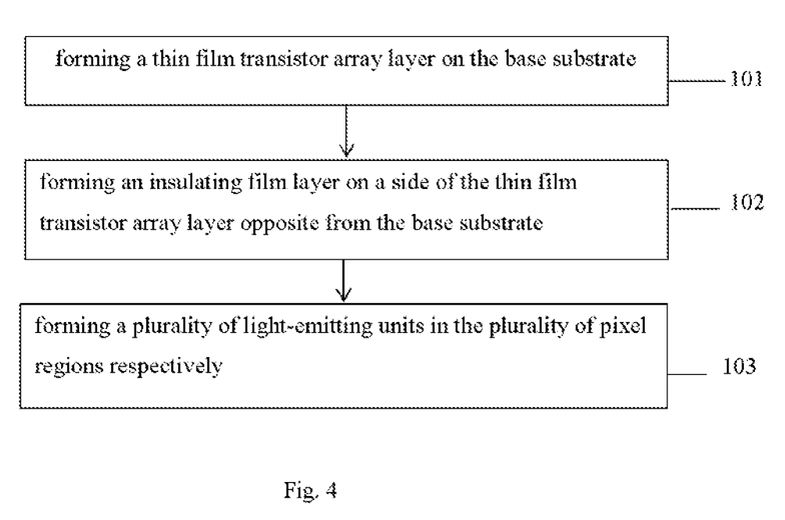
FIG. 4 is a flow chart of a process of manufacturing a display substrate according to one embodiment of the present disclosure.

One example of the present disclosure further provides a method for fabricating a display substrate, which is used for manufacturing the display substrate provided by the above embodiments. As shown in FIG. 1a-FIG. 1i and FIG. 4, the manufacturing method includes the following:

In step 101, a thin film transistor array layer 100 is formed on the base substrate 10, and the thin film transistor array layer 100 defines a plurality of groove structures 2 on a side opposite from the base substrate 10.

In step 102, a third insulating layer 17 is formed on a side of the thin film transistor array layer 100 opposite from the base substrate 10. The third insulating layer 17 defines a plurality of pixel regions 3 in the plurality of groove structures 2, and the pixel regions 3 and the groove structures 2 are in one to one correspondence.

In step 103, a plurality of light-emitting units is formed in the plurality of pixel regions 3 respectively, and the light-emitting units are in one-to-one correspondence with the pixel regions 3.

In one embodiment, a base substrate 10 is provided first, and the base substrate 10 can be a glass substrate. Then, a thin film transistor array layer 100 is formed on the base substrate 10. The thin film transistor array layer 100 includes a plurality of film layer patterns, and by arranging the positions, shapes and sizes of the film layer patterns, the thin film transistor array layer 100 can define a plurality of groove structures 2 on a side opposite from the base substrate 10. Then, an third insulating layer 17 is formed on a side of the thin film transistor layer opposite from the base substrate 10, and the third insulating layer 17 can define a plurality of pixel regions 3 in the plurality of groove structures 2. The material of the third insulating layer 17 may be selected from silicon oxide, silicon nitride or aluminum oxide, etc., and the third insulating layer 17 may serve as a passivation layer. Finally, corresponding light-emitting units are formed in the pixel regions 3 respectively.

In the method for fabricating the display substrate provided by the embodiment of the present disclosure, the thin film transistor array layer 100 can be configured to define a plurality of groove structures 2. Then, a corresponding plurality of pixel regions 3 are defined in the plurality of groove structures 2 through the insulating film layer 17. The groove inner walls of the groove structure 2 corresponding to the pixel region 3 are equivalent to the bank of the pixel defining layer in the prior art, and the in-slot space of the groove structure 2 corresponding to the pixel region 3 is equivalent to the pixel opening area defined by the pixel defining layer in the prior art. Therefore, when the light-emitting layer in the light-emitting unit is fabricated, the light-emitting layer can be directly formed in the pixel region 3 defined by the third insulating layer 17 by using an inkjet printing technique. Thus, there is no need to additionally create a pixel defining layer to define the pixel region 3 for fabricating the light-emitting units. In the method of preparing the display substrate according to one embodiment of the present disclosure, the processes of coating, exposing, developing and curing used to fabricate the pixel defining layer are avoided, thereby simplifying the preparation process of the display substrate. Moreover, the problem of environmental pollution caused by the use of organic material to form the pixel defining layer is also avoided.

In some embodiments, the step of fabricating the thin film transistor array layer 100 on the base substrate 10 specifically includes forming a plurality of thin film transistors on the base substrate 10. Each groove structure 2 corresponds to at least one thin film transistor, at least one thin film transistor defines a corresponding groove structure 2, and the output electrode 13 of the at least one thin film transistor serves as groove bottom of the groove structure 2.

In some embodiments, the step of fabricating the third insulating layer 17 covering the thin film transistor array layer 100 specifically includes the following:

A plurality of openings corresponding to the groove structure 2 is formed in the third insulating layer 17. The opening exposes the output electrode 13 of the corresponding at least one thin film transistor, and the output electrode 13 of the at least one thin film transistor is in contact with the corresponding light-emitting unit. At least one thin film transistor is configured to output a driving signal to the corresponding light-emitting unit through the output electrode 13 to drive the light-emitting unit to emit light.

In one embodiment, a plurality of thin film transistors can be fabricated on the base substrate 10 by using a fabrication process of the thin film transistor in the prior art, and a plurality of groove structures 2 are defined by the plurality of thin film transistors. The groove bottom of each groove structure 2 is the output electrode 13 of the corresponding thin film transistor. After the thin film transistor array layer 100 is fabricated, a third insulating layer 17 may be deposited on a side of the thin film transistor array layer 100 opposite from the base substrate 10. Furthermore, by the patterning process, a plurality of openings corresponding to the groove structures 2 in one-to-one correspondence is formed in the insulating film layer 17. Each opening exposes the output electrode 13 of the corresponding at least one thin film transistor. In this way, when the light-emitting unit is subsequently fabricated, the output electrode 13 can be more conveniently contacted with the light-emitting unit, thereby better driving the light-emitting unit to emit light.

It should be noted that the size of the opening provided in the third insulating layer 17 can be set according to actual needs. Illustratively, the opening exposes only the output electrode 13 at the bottom of the groove structure 2 without exposing other layers included in the thin film transistor. In one embodiment, the third insulating layer 17 may be provided to completely cover the inner side walls of the groove structure 2. In this way, the light-emitting unit formed in the pixel region 3 can only be in contact with the output electrode 13 at the bottom of the groove structure without contacting other film layers in the thin film transistor. As such, the short circuit between the light-emitting unit and other film layers in the thin film transistor is avoided, thereby ensuring stable performance of the display substrate.

In some embodiments, the above-mentioned light emitting unit may include two electrodes disposed opposite to each other and a light emitting layer disposed between the two electrodes. In one embodiment, the step of fabricating the light emitting unit in the pixel region 3 specifically includes forming a light-emitting layer in the pixel region. The light-emitting layer is in contact with the output electrode 13 of the corresponding at least one thin film transistor, and the output electrode 13 of the at least one thin film transistor is commonly used or shared as one electrode of the corresponding light-emitting unit. The other electrode of the light-emitting unit is fabricated on the side of the light-emitting layer opposite from the base substrate 10.

In one embodiment, the output electrode 13 of the at least one thin film transistor corresponding to the light emitting unit can be exposed through the opening in the insulating film layer 17, and the output electrode 13 can be in contact with the light-emitting unit to provide the driving signal to the light-emitting unit. Thus, the output electrode 13 can be directly used as one electrode of the light emitting unit. As such, when the light-emitting unit is fabricated, ink droplets for forming the light-emitting layer in the light-emitting unit are dropped onto the exposed output electrode 13 in the pixel region 3, and a light-emitting layer is formed on the output electrode 13. Then, another electrode of the light-emitting unit is fabricated on the side of the light-emitting layer opposite from the output electrode 13, thereby completing the fabrication of the light-emitting unit.

In the embodiments, using the output electrode 13 as one electrode of the light-emitting unit simplifies the manufacturing process of the light-emitting unit and reduces the manufacturing cost of the display substrate.

The manner in which the groove structure 2 is defined by the thin film transistor is various. The fabrication of the thin film transistor in two specific manners is described in detail below for illustration purpose only.

In the first manner, when each of the groove structures 2 corresponds to one thin film transistor, as shown in FIGS. 1a-1f the step of fabricating the thin film transistor specifically include the following:

First, the input electrode 11 and the first insulating island 12 are formed on the base substrate 10. The input electrode 11 and the first insulating island 12 are disposed in the same layer. In the direction perpendicular to the substrate 10, the height of the first insulating island 12 is greater than the height of the input electrode 11. The orthographic projection of the input electrode 11 on the base substrate 10 surrounds the orthographic projection of the first insulating island 12 on the base substrate 10.

Then, the output electrode 13 is formed on the surface of the first insulating island 12 opposite from the base substrate 10.

Then, an active layer 14 is formed on a side of the input electrode 11 opposite from the base substrate 10. The active layer 14 is in contact with the input electrode 11 and a portion of the output electrode 13, respectively. The orthographic projection of the active layer 14 on the base substrate 10 surrounds the orthographic projection of the output electrode 13 on the base substrate 10.

Then, a second insulating layer 15 is formed on a side of the active layer 14 opposite from the base substrate 10. Orthographic projection of the second insulating layer 15 on the base substrate 10 surrounds the orthographic projection of the output electrode 13 on the base substrate 10.

Then, a gate electrode 16 is formed on a side of the second insulating layer 15 opposite from the base substrate 10, and orthographic projection of the gate electrode 16 on the base substrate 10 is located inside the orthographic projection of the second insulating layer 15 on the base substrate 10. The orthographic projection of the gate electrode 16 on the base substrate 10 surrounds the orthographic projection of the output electrode 13 on the base substrate 10. The orthographic projection of the gate electrode 16 on the base substrate 10 at least partially overlaps the orthographic projection of the output electrode 13 on the base substrate 10.

In one embodiment, a conductive film is deposited on the base substrate 10 by using a magnetron sputtering device, and the conductive film is patterned to form the input electrode 11. The material of the conductive film may be Cu, Al or indium tin oxide. (ITO), etc. Then, a first insulating film is formed by plasma enhanced chemical vapor deposition, and the first insulating film is patterned to form the first insulating island 12. The material of the first insulating film may be selected from silicon oxide, silicon nitride, or the like, or the first insulating island 12 may be made of an organic material. The input electrode 11 and the first insulating island 12 are formed in the same layer. In a direction perpendicular to the base substrate 10, the height of the first insulating island 12 is greater than the height of the input electrode 11, and the orthographic projection of the input electrode 11 on the base substrate 10 surrounds the orthographic projection of the first insulating island 12 on the base substrate 10.

Then, a conductive film is deposited on the side of the first insulating island 12 opposite from the base substrate 10 by using a magnetron sputtering device, and the conductive film is patterned to form an output electrode 13. The output electrode 13 is located on the surface of the first insulating island 12 opposite from the base substrate 10. The material of the conductive film may be Cu, Al or indium tin oxide (ITO) or the like.

Then, the active layer 14 is formed on the side of the input electrode 11 opposite from the base substrate 10 by using a magnetron sputtering apparatus or a solution method in combination with a patterning process. The active layer 14 is in contact with the input electrode 11 and a portion of the output electrode 13, respectively, and the orthographic projection of the active layer 14 on the base substrate 10 surrounds the orthographic projection of the output electrode 13 on the base substrate 10.

Then, a second insulating film is formed on the side of the active layer 14 opposite from the base substrate 10 by using plasma enhanced chemical vapor deposition, and the second insulating film is patterned to form a second insulating layer 15. The material of the second insulating film may be selected from silicon oxide, silicon nitride or the like, and the second insulating layer 15 serves as a gate insulating layer in the thin film transistor. The orthographic projection of the second insulating layer 15 on the base substrate 10 surrounds the orthographic projection of the output electrode 13 on the base substrate 10.

Finally, a conductive film is deposited on the side of the second insulating layer 15 opposite from the base substrate 10 by using a magnetron sputtering device, and the conductive film is patterned to form the gate electrode 16. The orthographic projection of the gate electrode 16 on the base substrate 10 is located inside the orthographic projection of the second insulating layer 15 on the base substrate 10. The orthographic projection of the gate electrode 16 on the base substrate 10 surrounds the orthographic projection of the output electrode 13 on the base substrate 10. The orthographic projection of the gate electrode 16 on the base substrate 10 and the orthographic projection of the output electrode 13 on the base substrate 10 at least partially overlap. The material of the conductive film may be selected from Cu, Al or indium tin oxide (ITO).

In the thin film transistor fabricated by the above fabrication method, the input electrode 11 and the first insulating island 12 are formed on the base substrate 10, and the output electrode 13 is formed on the first insulating island 12 such that a height difference between the input electrode 11 and the output electrode 13 is formed. Then, the active layer 14, the second insulating layer 15 and the gate electrode 16 are sequentially formed on the input electrode 11 and the output electrode 13, thereby forming a height difference between the gate electrode 16 and the output electrode 13. Since the active layer 14, the second insulating layer 15, and the gate electrode 16 are all formed around the output electrode 13, and expose the output electrode 13, a groove structure 2 is formed on the output electrode 13. That is, the output electrode 13 serves as the groove bottom of the groove structure 2, and the side walls of the active layer 14, the second insulating layer 15, and the gate electrode 16 serve as the groove inner side walls of the groove structure 2. When the third insulating layer 17 is subsequently formed, the third insulating layer 17 can expose the output electrode 13 at the bottom of the groove structure while covering the inner walls of the groove structure 2 and the gate electrode 16 at the topmost layer of the thin film transistor.

The thin film transistor fabricated by the above fabrication method can define an enclosed groove structure 2 such that third insulating layer 17 can define the pixel region 3 in the groove structure 2 as an enclosed region. Thus, when the ink droplets for forming the light-emitting layer in the light-emitting unit are dropped into the pixel region 3 by the ink-jet printing technique, the ink droplets can be defined in the pixel region 3 without flowing into other non-pixel regions. Therefore, the ink droplets are prevented from spreading into other areas to contaminate adjacent pixels, thereby avoiding cross-color phenomenon.

In the second manner, when each of the groove structures corresponds to two thin film transistors, two thin film transistors are disposed on opposite sides of the groove structure 2, as shown in FIGS. 1*a* to 1*i*, and the steps of fabricating the thin film transistor specifically include the following:

First, an input electrode 11 and a first insulating island 12 are formed on the base substrate 10. The input electrode 11 and the first insulating island 12 are disposed in the same layer. In a direction perpendicular to the base substrate 10, a height of the first insulating island 12 is greater than a height of the input electrode 11.

Then, the output electrode 13 is formed on the surface of the first insulating island 12 opposite from the base substrate 10.

Then, an active layer 14 is formed on a side of the input electrode 11 opposite from the base substrate 10, and the active layer 14 is in contact with the input electrode 11 and a portion of the output electrode 13, respectively.

Then, a second insulating layer 15 is formed on a side of the active layer 14 opposite from the base substrate 10.

Finally, a gate electrode 16 is formed on a side of the second insulating layer 15 opposite from the base substrate 10. Orthographic projection of the gate electrode 16 on the base substrate 10 is located inside orthographic projection of the second insulating layer 15 on the base substrate 10. The orthographic projection of the gate electrode 16 on the base substrate 10 at least partially overlaps the orthographic projection of the output electrode 13 on the base substrate 10.

In one embodiment, the gate electrodes 16 of the two thin film transistors are connected, the input electrodes 11 of the two thin film transistors are connected, and the two thin film transistors share the same output electrode 13 and the same first insulating island 12.

In one embodiment, a conductive film is deposited on the base substrate 10 by using a magnetron sputtering device, and the conductive film is patterned to form an input electrode 11. The material of the conductive film may be selected from Cu, Al or indium tin oxide (ITO). Then, a first insulating film is formed by plasma enhanced chemical vapor deposition, and the first insulating film is patterned to form a first insulating island 12. The material of the first insulating film may be selected from silicon oxide, silicon nitride, or the like, or the first, insulating island 12 may be made of an organic material. The input electrode 11 and the first insulating island 12 are disposed in the same layer, and the height of the first insulating island 12 is greater than the height of the input electrode 11 in a direction perpendicular to the base substrate 10.

In one embodiment, a conductive film is deposited on the side of the first insulating island 12 opposite from the base substrate 10 by using a magnetron sputtering device, and the conductive film is patterned to form an output electrode 13. The output electrode 13 is located on the surface of the first insulating island 12 opposite from the base substrate 10. The material of the conductive film may be Cu, Al or indium tin oxide (ITO).

In one embodiment the active layer 14 is formed on the side of the input electrode 11 opposite from the base substrate 10 by using a magnetron sputtering device or a solution method in combination with a patterning process. The active layer 14 is in contact with the input electrode 11 and a portion of the output electrode 13 respectively.

In one embodiment, a second insulating film is formed on the side of the active layer 14 opposite from the base substrate 10 by using plasma enhanced chemical vapor deposition, and the second insulating film is patterned to form a second insulating layer 15. The material of the second insulating film may be selected from silicon oxide, silicon nitride, or the like, and the second insulating layer 15 serves as a gate insulating layer in the thin film transistor.

Finally, a conductive film is deposited on the side of the second insulating layer 15 opposite from the base substrate 10 by using a magnetron sputtering device, and the conductive film is patterned to form the gate electrode 16. The orthographic projection of the gate electrode 16 on the base substrate 10 is located inside the orthographic projection of the second insulating layer 15 on the base substrate 10. The orthographic projection of the gate electrode 16 on the base substrate 10 at least partially overlaps the orthographic projection of the output electrode 13 on the base substrate 10. The material of the above conductive film may be selected from Cu, Al or indium tin oxide (ITO).

In fabricating the thin film transistor according to some embodiments of the present disclosure, the input electrode 11 and the first insulating island 12 are formed on the base substrate 10, and the output electrode 13 is formed on the first insulating island 12 such that a height difference is formed between the input electrode 11 and the output electrode 13. Then, the active layer 14, the second insulating layer 15 and the gate electrode 16 are sequentially formed on the input electrode 11 and the output electrode 13, thereby forming a height difference between the gate electrode 16 and the output electrode 13. The active layer 14, the second insulating layer 15, and the gate electrode 16 are stacked on the output electrode 13, and all the layers can expose at least a part of the output electrode 13. Therefore, the output electrode 13 can serve as the groove bottom of the groove structure 2, and the sidewalls of the active layer 14, the second insulating layer 15, and the gate electrode 16 serve as the groove inner sidewalls of the groove structure 2. Therefore, the two thin film transistors are disposed on opposite sides of the corresponding groove structure by using the above manufacturing method, so that the two thin film transistors form opposite side walls of the groove structure 2. As such, the two thin film transistors define an unenclosed groove structure 2. When the third insulating layer 17 is subsequently formed, the third insulating layer 17 can expose the output electrode 13 at the bottom of the groove structure while covering the sidewalls of the groove structure 2 and the gate electrode 16 at the topmost layer of the thin film transistor. When an inkjet printing technique is used to drop ink droplets for forming a light-emitting layer in a light-emitting unit into a pixel region, the ink droplets can also be confined in the pixel region without flowing into other non-pixel regions.

In some embodiments, the manufacturing method provided by the above embodiments further includes the following;

The portion of the third insulating layer 17 outside the groove structure 2 is exposed to an ultraviolet ray, so that a surface of the portion of the third insulating layer 17 outside the groove structure 2 opposite from the base substrate 10 is hydrophobic.

In one embodiment, after the third insulating layer 17 is formed, the portion of the third insulating layer 17 outside the groove structure 2 may be exposed to an ultraviolet ray, and a surface of the portion of the third insulating layer 17 outside the groove structure 2 opposite from the base substrate 10 is hydrophobic. More specifically, the mask plate including a light-shielding region and a light-transmitting region may be aligned with the third insulating layer 17 such that the light-transmitting region of the mask plate corresponds to the portion of the third insulating layer 17 outside the groove structure 2, and the light-shielding region of the mask corresponds to the portion other than the portion of the third insulating layer 17 outside the groove structure 2. Then, the third insulating layer 17 is exposed to the ultraviolet ray through the mask, so that the portion of the third insulating layer 17 located outside the groove structure 2 under irradiation of the ultraviolet ray changes the surface property. As such, the surface of the portion of the third insulating layer 17 located outside the groove structure 2 is made hydrophobic.

In the embodiment, the light-emitting layer in the light-emitting unit is generally fabricated by inkjet printing technology, and the portion where the third insulating layer 17 is disposed outside the groove structure 2 is hydrophobic on its surface opposite from the base substrate 10. As such, it is possible to enable droplets for forming the light-emitting layer to be printed into the pixel region 3 more stably and accurately when the light-emitting layer is formed by inkjet printing technology.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A pixel structure, comprising:
    a base substrate;
    a first insulating island on a side of the base substrate;
    a first electrode on a side of the first insulating island opposite from the base substrate;
    a second electrode on the base substrate and at a peripheral area of the first insulating island;
    an active layer electrically connected to the first electrode and the second electrode;
    a second insulating layer on a side of the active layer opposite from the base substrate;
    a gate electrode on a side of the second insulating layer opposite from the base substrate; and
    a third insulating layer on a side of the gate electrode opposite from the base substrate; wherein,
    the third insulating layer encloses a groove structure with the first electrode;
    the third insulating layer covers at least a side surface of one of the active layer, the second insulating layer or the gate electrode to form the groove structure with the first electrode;
    a height of the first insulating island in a direction perpendicular to the base substrate is greater than a height of the second electrode in the direction perpendicular to the base substrate;
    the first electrode and the second electrode are two different electrodes selected from a source electrode and a drain electrode; and
    wherein the second electrode comprises a first sub-electrode and a second sub-electrode spaced apart from each other, the first sub-electrode and the second sub-electrode are on opposite sides of the first insulating island.

2. The pixel structure of claim 1, wherein a surface of the second electrode opposite from the base substrate is not in a same level with a surface of the first insulating island opposite from the base substrate.

3. The pixel structure of claim 1, wherein the third insulating layer serves as side walls of the groove structure, and the first electrode serves as a bottom of the groove structure.

4. The pixel structure of claim 3, wherein the second electrode is in contact with side surfaces of the first insulating island.

5. The pixel structure of claim 1, wherein the first electrode is conformal with the first insulating island.

6. The pixel structure of claim 1, wherein the active layer contacts with the first and second electrodes and with side surfaces of the first insulating island.

7. The pixel structure of claim 1, wherein the second insulating layer is conformal with the active layer.

8. The pixel structure of claim 1, wherein the gate electrode is conformal with the second insulating layer.

9. The pixel structure of claim 1, wherein a portion of the third insulating layer is conformal with the gate electrode and another portion thereof covers side surfaces of the active layer, the second insulating layer and the gate electrode to form the groove structure with the first electrode.

10. The pixel structure of claim 1, wherein the active layer contacts with a side surface of the first insulating island and a side surface of the first electrode.

11. The display substrate of claim 1, wherein at least a surface of the third insulating layer opposite from the base substrate is hydrophobic.

12. A display apparatus, comprising the pixel structure of claim 1.

13. A method of manufacturing a pixel structure, comprising:
    forming a base substrate;
    forming a first insulating island on a side of the base substrate;
    forming a first electrode on a side of the first insulating island opposite from the base substrate;
    forming a second electrode on the base substrate and at a peripheral area of the first insulating island;
    forming an active layer electrically connected to the first electrode and the second electrode;
    forming a second insulating layer on a side of the active layer opposite from the base substrate;
    forming a gate electrode on a side of the second insulating layer opposite from the base substrate; and
    forming a third insulating layer on a side of the gate electrode opposite from the base substrate; wherein,
    the third insulating layer encloses a groove structure with the first electrode;
    the third insulating layer covers at least a side surface of one of the active layer, the second insulating layer or the gate electrode to form the groove structure with the first electrode;
    a height of the first insulating island in a direction perpendicular to the base substrate is greater than a height of the second electrode in the direction perpendicular to the base substrate;

the first electrode and the second electrode are two different electrodes selected from a source electrode and a drain electrode; and the second electrode comprises a first sub-electrode and a second sub-electrode spaced apart from each other, and the first sub-electrode and the second sub-electrode are on opposite sides of the first insulating island.

14. The method of claim 13, wherein a surface of the second electrode opposite from the base substrate is not in a same level with a surface of the first insulating island opposite from the base substrate.

15. The method of claim 13, wherein the third insulating layer serves as side walls of the groove structure and the first electrode serves as a bottom of the groove structure.

16. The method of manufacturing a display substrate of claim 13, further comprising:

exposing a portion of the third insulating layer outside the groove structure to an ultraviolet ray, so that a surface of the portion of the third insulating layer outside the groove structure opposite from the base substrate is hydrophobic.

\* \* \* \* \*